US007013023B2

(12) United States Patent
Ehrmann Patin et al.

(10) Patent No.: US 7,013,023 B2
(45) Date of Patent: Mar. 14, 2006

(54) METHOD AND DEVICE FOR SENDING AND RECEIVING DIGITAL IMAGES USING AN IMAGE WATERMARK FOR DECODING

(75) Inventors: Frédérique Ehrmann Patin, Rennes (FR); Ioana Donescu, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 728 days.

(21) Appl. No.: 10/029,673

(22) Filed: Dec. 31, 2001

(65) Prior Publication Data

US 2002/0124174 A1 Sep. 5, 2002

(30) Foreign Application Priority Data

Jan. 18, 2001 (FR) .................................. 01 00676

(51) Int. Cl.
  *G06K 9/00* (2006.01)
  *H04L 9/00* (2006.01)
(52) U.S. Cl. ...................................... 382/100; 713/176
(58) Field of Classification Search ............... 382/100, 382/232; 380/210, 217, 51, 218, 31, 35; 713/176, 179, 181; 348/460, 461, 465; 725/20, 725/22, 105, 126; 375/340, 341, 342; 370/522, 370/527; 704/200.1, 273; 381/73.1; 358/3.28, 358/436, 426.12
See application file for complete search history.

(56) References Cited

U.S. PATENT DOCUMENTS

| 5,761,248 A | 6/1998 | Hagenauer et al. ......... 375/340 |
| 6,320,829 B1 * | 11/2001 | Matsumoto et al. ..... 369/47.12 |
| 6,587,944 B1 * | 7/2003 | Yeung et al. ............... 713/176 |
| 6,711,710 B1 * | 3/2004 | Jiang et al. ................. 714/784 |
| 6,785,815 B1 * | 8/2004 | Serret-Avila et al. ....... 713/176 |

FOREIGN PATENT DOCUMENTS

| EP | 0 933 919 | 8/1999 |
| EP | 1 009 098 A1 | 6/2000 |
| EP | 1 043 687 A1 | 10/2000 |
| WO | WO 00/22605 | 4/2000 |

OTHER PUBLICATIONS

"Multimedia Data-Embedding And Watermarking Technologies", M. Swanson, et al., Proceeding of the IEEE, vol. 86, No. 6, Jun. 1998, pps. 1064-1087.
"Codes for Channels with Insertions, Deletions and Substitutions", E. Ratzer, et al., 2nd International Symposium on Turbo Codes & Related Topics, Brest, France, 2000, pps. 149-156.
"Effective Channel Coding for DCT Watermarks", S. Pereira, et al., University of Geneva, three (3) pps.
"Near Shannon Limit Error—Correcting Coding and Decoding: Turbo-Codes (1)", C. Berrou, et al., Proceedings of the International Conference on Communications (ICC), Geneva, May 23-26, 1993, pps. 1064-1070.
French Search Report.

\* cited by examiner

Primary Examiner—Joseph Mancus
Assistant Examiner—Shefali Patel
(74) Attorney, Agent, or Firm—Fitzpatrick, Cella, Harper & Scinto (57) ABSTRACT

In order to decode a received digital signal which has been watermarked with a known watermark, at least part of the digital signal is decoded by using a parametrisable iterative decoder, the watermark is extracted from the decoded signal, the extracted watermark is compared with the known watermark, and at least one parameter of the decoder is modified if necessary, according to the result of the comparison.

52 Claims, 6 Drawing Sheets

METHOD AND DEVICE FOR SENDING AND RECEIVING DIGITAL IMAGES USING AN IMAGE WATERMARK FOR DECODING

The present invention relates to a method and a device for sending and receiving digital images using an image watermark for decoding.

More precisely, the present invention relates to the transmission of digital images in which a known watermark is inserted, on a noisy channel, when the system for protection against transmission errors uses soft decision decoding, which entails a parameterisable iterative decoding, that is to say it is for example possible to vary the parameter indicating the number of iterations.

By way of in no way limitative example, the present invention is described here in its application to turbocodes.

Turbocodes are very advantageous in conditions of low signal to noise ratios (SNR), which are encountered more particularly on wireless links with a great distance between the transmitter and receiver.

Figure 1:
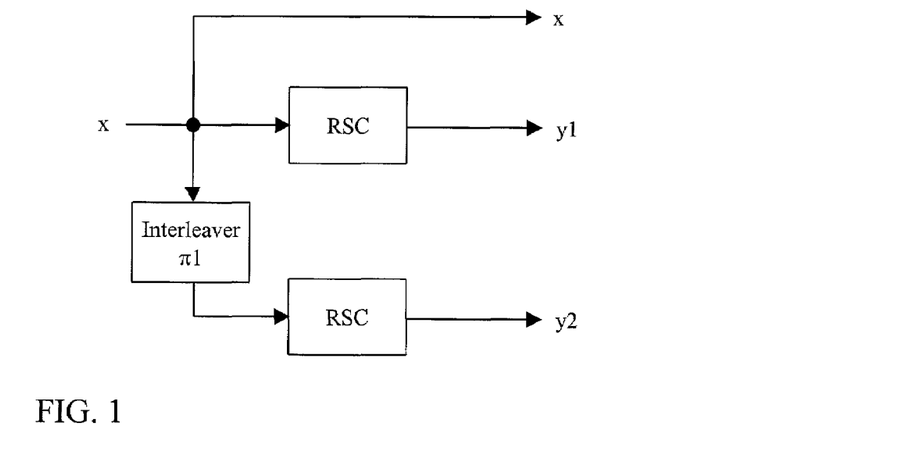
FIG. 1, already described, depicts schematically the structure of a conventional turbo-encoder.

A conventional turbo-encoder consists of two recursive systematic convolutional (RSC) encoders and an interleaver, disposed as shown in FIG. 1. The turbo-encoder outputs three series of binary elements (x, y1, y2), where x is the so-called systematic output of the turbo-encoder, that is to say one which has not undergone any processing compared with the input signal x, y1 is the output encoded by the first RSC encoder, and y2 is the output encoded by the second RSC encoder after passing through the interleaver.

For more details on turbocodes, reference can usefully be made to the article by C. Berrou, A. Glavieux and P. Thitimajshima entitled "*Near Shannon limit error-correcting coding and decoding: turbo-codes*", ICC '93, Geneva.

Figure 2:
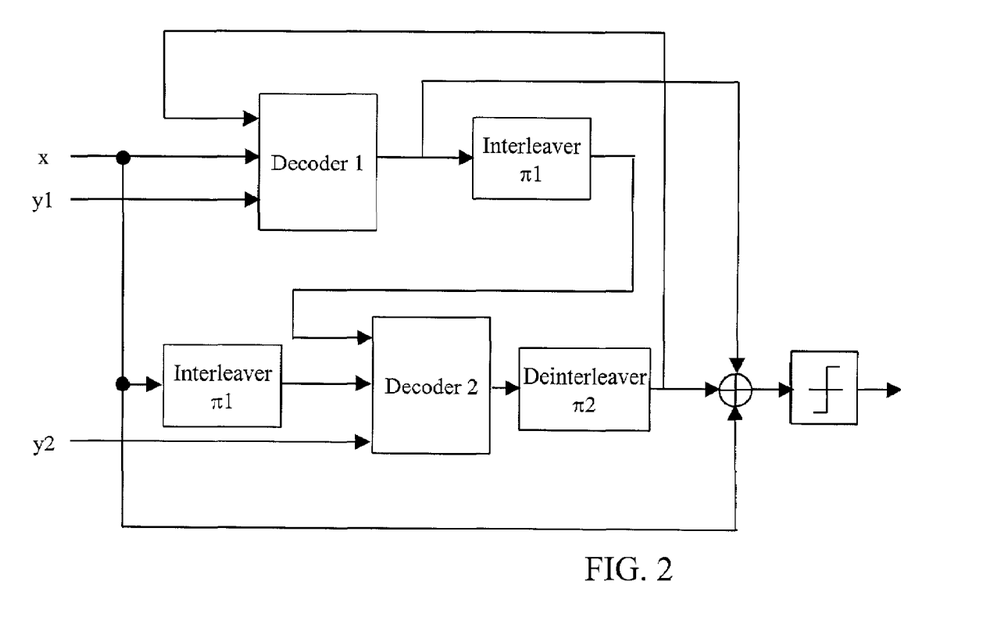
FIG. 2, already described, schematically depicts the structure of a conventional turbodecoder.

FIG. 2 depicts an example of a conventional turbodecoder able to decode data supplied by a turbo-encoder like the one in FIG. 1. The inputs x, y1, y2 of the turbodecoder are the outputs of the turbo-encoder as received by the decoder after passing through the transmission channel, considered here as being ideal in order to facilitate the description. The structure of such a turbodecoder is well known to experts and will therefore not be described in detail here.

As can be seen in FIG. 2, the complete decoder has a very complex structure. It requires in particular two decoders, designated as "Decoder 1" and "Decoder 2" in FIG. 2, for example of the BCJR type, that is to say using the algorithm of Bahl, Cocke, Jelinek and Raviv, or of the SOVA ("*Soft Output Viterbi Algorithm*") type.

A conventional turbodecoder also requires a looping back of the output of the deinterleaver $\pi 2$ onto the input of the first decoder, in order to transmit the so-called "extrinsic" information from the second decoder to the first decoder.

A system of signal protection by turbocodes requires carrying out a certain number of decoding iterations on reception in order to decode the received signal.

The problem is to know how many iterations to carry out on reception in order to guarantee good quality, the aim being to minimise the number of iterations in order to save calculation time and gain in speed, whilst keeping a good quality of decoded data. It is therefore advantageous to adapt the number of iterations flexibly to the decoding.

On the other hand, it is possible to insert supplementary information in data using watermarking systems.

The watermarking of images consists of inserting an indelible watermark directly in the digitised data, the insertion of this watermark being assimilated to the encoding of a supplementary information item in the data.

A general state of the art of watermarking for fixed images and video is given in the article by M. Swanson, M. Kobayashi and A. Tewfik entitled "*Multimedia data-embedding and watermarking technologies*", in Proc. of the IEEE, Vol. 86, No. 6, June 1998.

The use is preferably made of a so-called invisible watermark, which exhibits the following factors:

this watermark is imperceptible, that is to say the insertion of such a watermark must preserve the perceptual quality of the digital data. The imperceptibility of the watermark also makes it difficult to pirate;

this watermark is indelible, that is to say it is statistically undetectable in the watermarked digital data, in order to resist intentional attacks for destroying this watermark.

There are several categories of watermarking, according to their purpose.

A first category contains copyright protection methods, for which the watermark must be robust to the various types of processing applied to the image: compression, change of format, filtering.

A second category concerns the methods intended to authenticate the digital data themselves and to reveal any possible change undergone by the image. In this second case, fragile methods are spoken of.

There exists an intermediate category of method: the so-called semi-fragile methods, which make it possible to obtain robustness for a particular fixed distortion (such as, for example, compression with a predetermined compression ratio), but not for other types of modification of the image.

Up to the present time, the turbocodes used for images in which a watermarking is inserted aimed at protecting solely the watermarking itself, and not the image. On this point, reference can usefully be made to the article by S. Pereira, S. Voloshynovski and T. Pun entitled "*Effective channel coding for DCT watermarks*", which appeared in International Conference on Image Processing, September 2000.

In addition, it is known that the watermarks inserted in images can serve to estimate the quality of the channel. In this regard, reference can usefully be made to the article by E. A. Ratzer and D. J. C. Mackay entitled "*Codes for channels with insertions, deletions and substitutions*", which appeared in the $2^{nd}$ International Symposium on Turbo-codes & Relative Topics, Brest, France, September 2000.

For turbocodes, the number of iterations for decoding is generally fixed, either empirically, or according to a predetermined stop criterion. For example, the document U.S. Pat. No. 5,761,248 describes a stop criterion for the iterations of an iterative decoder based on entropy.

Another way of fixing the number of iterations consists of sending a known sequence at the start before sending the data. The decoding of the pilot sequence makes it possible to estimate the number of iterations to be carried out. This technique has the drawback of making it possible to estimate the number of iterations only once, rather than continuously.

The aim of the present invention is to remedy the aforementioned drawbacks, by using a watermarking known from the receiver as a pilot in data to be transmitted for, once this marking has been decoded, obtaining an estimation of the quality of the transmission channel and, therefore, deducing therefrom the number of iterations necessary for obtaining a given reception quality.

To this end, the present invention proposes a method of sending a digital signal, remarkable in that it includes steps according to which:

a watermarking operation is performed, consisting of inserting a watermark, which is known to a receiving end, in the digital signal, so as to obtain a watermarked digital signal;

an encoding operation is performed, consisting of encoding the watermarked digital signal by means of an encoder, so as to obtain an encoded watermarked signal which can be decoded by means of a parameterisable iterative decoder; and a sending operation is performed, consisting of sending the encoded watermarked signal, whereby in the receiving end, at least one parameter of the decoder can be modified according to the result of the comparison between a watermark obtained from the encoded watermarked signal and the known watermark.

Thus the invention makes it possible to determine the number of iterations necessary for the decoding of the image with satisfactory quality, using on reception the watermark inserted in the image as a pilot.

Given that the data and the watermark pass through the transmission channel at the same time, they are degraded in the same way. The channel estimation carried out by virtue of the watermark is therefore, because of this, valid for the data.

In this way a stop criterion is obtained which makes it possible to know how many iterations it is necessary to make.

In addition, the number of iterations to be made is updated continuously as time goes by.

In a particular embodiment, the encoder is a turbo-encoder.

Turbocodes offer better protection for data against transmission errors, the uncorrected number of which decrease very rapidly for a slight increase in the signal to noise ratio.

In a particular embodiment, a modulation operation is also performed, consisting of modulating the encoded watermarked signal before the sending operation.

The modulated signal obtained has characteristics better adapted to the required conditions of use. The modulation makes it possible for example to transpose, without loss of information, the spectrum of a signal into another frequency domain in order to adapt to the sending/reception constraints (efficacy and size of the antennae), to satisfy conditions imposed by a transmission channel (propagation, available bandwidth) or to facilitate certain signal processing operations.

The modulation also makes it possible to provide sharing of a communication channel between several signals transmitted simultaneously (frequency multiplexing: allocation of a different frequency band to each message transmitted simultaneously, time multiplexing: sequential transmission of sampled values of each message).

The modulation also makes it possible to obtain the amplification and effective filtering of weak low-frequency signals by becoming free, in particular, from the 1/f background noise.

The modulation also makes it possible, for example:

to record signals whose spectrum extends as far as zero frequency, on magnetic media (measurement recorders), to modify the spectrum of the signal sent in order to improve the conditions for detection (radar) and immunity from noise (angular and pulse modulations), to make the communication more confidential and difficult to jam (band spreading system), to vary an appropriate quantity for the automatic adjustment or control of machines or industrial processes.

According to a particular characteristic, the modulation operation consists of modulating the encoded watermarked signal by means of a modulation of the QPSK type.

Phase modulation has the advantage of increasing immunity to noise at a cost of the broadening of the band occupied by the spectrum of the modulated signal (this is a non-linear operation), by modifying proportionally to the signal modulating the phase or the frequency of the sinusoidal carrier, instead of increasing the power of the signal sent.

As a variant, the modulation operation consists of modulating the encoded watermarked signal by means of a modulation of the OFDM type.

OFDM modulation offers the advantage of distributing the signal to be transmitted over a large number of sub-carriers in parallel, individually modulated at low rate by only a fraction of the data to be transmitted. The rate being low for each individual sub-carrier, each associated bandwidth is smaller than the total bandwidth and therefore there is less risk of the amplitude and phase characteristics varying over the spectrum of the frequencies constituting each individual bandwidth. It is thus possible to offer good transmission quality at high rate, at the cost obviously of an increase in the resources employed.

According to a particular characteristic, the watermarking operation uses a technique of the fragile or semi-fragile type.

This makes it possible to characterise the losses of information due to transmission.

In a particular embodiment, the digital signal is an image signal.

The domain of the image processing constitutes in fact a favoured application of the invention.

For the same purpose as indicated above, the present invention also proposes a device for sending a digital signal, remarkable in that it has:

a watermarking unit, for inserting a watermark, which is known to a receiving end, in the digital signal, the watermarking unit outputting a watermarked digital signal;

an encoding unit, for encoding the watermarked digital signal by means of an encoder, the encoding unit outputting an encoded watermarked signal which can be decoded by means of a parameterisable iterative decoder; and a sending module, for sending the encoded watermarked signal, whereby in the receiving end, at least one parameter of the decoder can be modified according to the result of the comparison between a watermark obtained from the encoded watermarked signal and the known watermark.

The particular characteristics and advantages of the sending device being the same as those of the sending method, they are not repeated here.

Still for the same purpose, the present invention also proposes a method of decoding a received digital signal, this digital signal having been watermarked by a known watermark, remarkable in that it includes steps according to which:

a decoding operation is performed, consisting of decoding at least part of the digital signal by means of a parameterisable iterative decoder;

a watermark extraction operation is performed, consisting of extracting the watermark from the decoded signal;

a comparison operation is performed, consisting of comparing the extracted watermark with the known watermark; and a modification operation is performed, consisting of modifying if necessary at least one decoding parameter according to the result of the comparison.

Use is thus made of the known watermark inserted in the data as a pilot enabling to parameterise the decoding with a view to improving it.

According to a particular characteristic, the modification operation includes:

an operation of calculating the number of iterations to be applied to the decoding, consisting of determining a number of iterations to be applied as a parameter of the decoding, according to the result of the comparison; and an operation of adjustment of the decoding, consisting of applying during decoding the number of iterations previously determined.

The invention thus makes it possible to determine the most appropriate number of iterations for decoding by virtue of the known watermark inserted in the data.

In a particular embodiment, the decoding operation is a partial decoding operation, consisting of decoding the data by means of an iterative decoder, by applying an iteration or a half-iteration, so as to obtain a watermarked, partially decoded digital signal, and in that the modification operation includes:

a quality testing operation, consisting of testing whether the quality of the extracted watermark is satisfactory; and as long as the quality is not satisfactory, an additional iteration or half-iteration in the decoding, so as to obtain in the end the optimum number of iterations or half-iterations to be applied as a parameter of the decoding.

This makes it possible to make only the exact number of iterations or half-iterations necessary; it is a gradual adjustment as time passes.

In a particular embodiment, the iterative decoder is a turbodecoder.

This particular embodiment has the same advantages as the use of a turbo-encoder on sending.

In a favoured application of the invention, the digital signal is an image signal.

Still for the same purpose, the present invention also proposes a method of receiving a digital signal, remarkable in that it includes steps according to which:

a reception operation is performed, consisting of receiving modulated symbols;

a demodulation operation is performed, consisting of demodulating the modulated symbols received, so as to obtained demodulated data; and a decoding operation is performed, consisting of decoding the demodulated data by using a decoding method as above.

The demodulation operation can consist of applying a demodulation corresponding to a modulation of the QPSK type, or to a modulation of the OFDM type.

Still for the same purpose, the present invention also proposes a device for decoding a received digital signal, this digital signal having been watermarked by means of a known watermark, remarkable in that it has:

a decoding module, for decoding at least part of the digital signal by means of a parameterisable iterative decoder;

a watermark extraction unit, for extracting the watermark from the decoded signal;

a comparison unit, for comparing the extracted watermark with the known watermark; and a modification unit, for modifying at least one parameter of the decoding according to the result of the comparison.

The particular characteristics and advantages of the decoding device being similar to those of the decoding method, they are not repeated here.

Still for the same purpose, the present invention also proposes a device for receiving a digital signal, remarkable in that it has:

a reception unit, for receiving modulated symbols;

a demodulation unit, for demodulating the modulated symbols received, the demodulation unit outputting demodulated data; and a decoding unit, for decoding the demodulated data by means of a decoding device as above.

The present invention also relates to a digital signal processing apparatus, having means adapted to implement a sending method and/or a decoding method as above.

The present invention also relates to a digital signal processing apparatus, having a sending device and/or a decoding device as above.

The present invention also relates to a telecommunications network, having means adapted to implement a sending method and/or a receiving method as above.

The present invention also relates to a telecommunications network, having a sending device and/or a receiving device as above.

The present invention also relates to a mobile station in a telecommunications network, having means adapted to implement a sending method and/or a receiving method as above.

The present invention also relates to a mobile station in a telecommunications network, having a sending device and/or a receiving device as above.

The present invention also relates to a base station in a telecommunications network, having means adapted to implement a sending method and/or a receiving method as above.

The present invention also relates to a base station in a telecommunications network, having a sending device and/or a receiving device as above.

The invention also relates to:

an information storage means which can be read by a computer or a microprocessor storing instructions of a computer program, making it possible to implement a sending method and/or a decoding method as above, and an information storage means which is removable, partially or totally, which can be read by a computer or a microprocessor storing instructions of a computer program, making it possible to implement a sending method and/or a decoding method as above.

The invention also relates to a computer program product containing sequences of instructions for implementing a sending method and/or a decoding method as above.

The particular characteristics and advantages of the receiving method and device, of the different digital signal processing apparatus, of the different telecommunications networks, of the different mobile stations, of the information storage means and of the computer program product being the same as those of the sending method according to the invention, these particular characteristics and advantages are not repeated here.

Other aspects and advantages of the invention will emerge from a reading of the following detailed description of particular embodiments of the invention, given by way of non-limitative examples. The description refers to the drawings which accompany it, in which.

Figure 3:
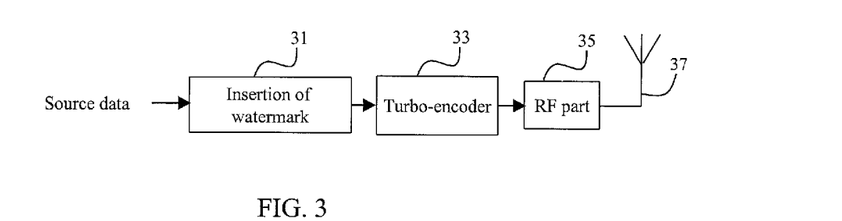
FIG. 3 depicts schematically a sending device according to the present invention, in a particular embodiment.

As shown in FIG. 3, a sending device according to the present invention has a watermark insertion module 31, which receives source data at an input and which produces a stream of data corresponding to the source data in which a certain watermark or pilot is inserted, known to the receiver.

The watermarking methods used in the present invention are of the fragile or semi-fragile type, so as to be able to characterise the information losses due to transmission.

The data stream produced by the module 31 is supplied as an input to a turbo-encoder 33, before being sent over a transmission channel by means of a radio module 35 and an antenna 37.

The watermark is an additional information item, consisting of one or more information bits arranged in a predetermined order, this information being inserted imperceptibly in the source data. Conventionally, a watermarking system consists of two parts: a part which effects the insertion of the watermark, which is also sometimes referred to as the encoder, and a part which effects the extraction of the watermark, which is also referred to as the decoder.

Figure 4:
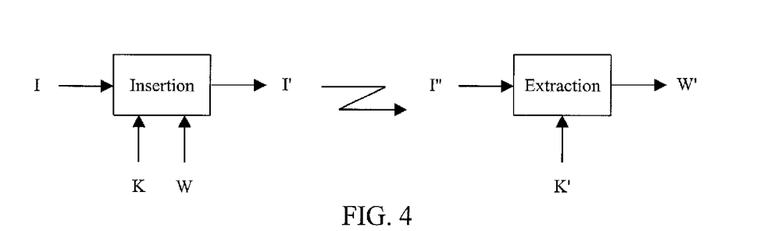
FIG. 4 illustrates schematically the functioning of a conventional image watermarking system.

The overall functional diagram of the watermarking is set out in FIG. 4. I is the original image, I' is the watermarked image, K is a secret key and W is the inserted information.

After processing (compression, transmission, etc), there is obtained at the decoder an image I" which is a version of the watermarked image I' which has undergone any modifications. A key K' is necessary for extracting the watermark. In the majority of methods, K'=K. An estimated version of the watermark W, denoted W', is extracted. It should be noted that the key is used when it is wished to make the pirating of the watermark more difficult. This parameter is optional if protection is not necessary and will not be used here.

For the invention, it is assumed that the inserted information W is completely known to the decoder and, as will be seen later, a step of estimation of the watermark, whose purpose is to exploit the comparison of W and W' in order to evaluate the quality of the received image, is added.

There are now described, by way of non-limitative examples, two watermarking techniques able to be applied in the context of the present invention.

Figure 5:
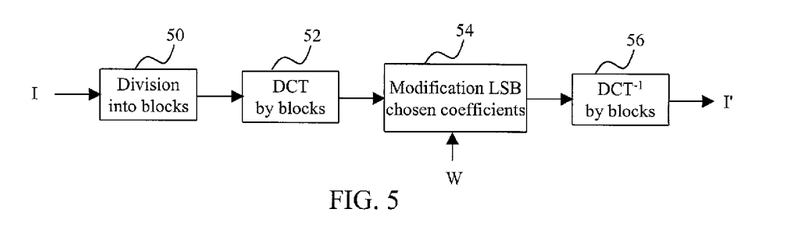
FIG. 5 illustrates schematically an image watermarking technique able to be used in the present invention.

According to a first watermarking technique illustrated in FIG. 5, the insertion of the watermark is applied to a set of spatio-frequency coefficients obtained by dividing the image into blocks (step 50) and applying a discrete cosine transform (DCT) to each block (step 52).

This technique is in particular used in the JPEG compression standard, with blocks of size 8×8. W is a binary image thumbnail (a logo, a set of pseudo-random values) of size (M/8)×(N/8) if the image I is of size M×N.

After the application of the DCT, the watermark W is inserted (step 54). It should be noted that, if it is wished to effect a watermarking compatible with a compression of the digital image, step 52 is followed by a scalar quantisation step, coefficient by coefficient. Insertion of the watermark then takes place in the quantised/dequantised coefficients.

For each DCT block, a set of coefficients is preselected whose absolute value is greater than a predetermined threshold value. A bit of the watermark W is associated with each DCT block, by spatial matching, that is to say, if an index is associated with the video scanning sequence, the bit $w_k$ is inserted in the $k^{th}$ DCT block.

Insertion proper takes place in two steps:

for each coefficient selected, a check bit is calculated from the most significant bits which represent the value of the coefficient. For example, if the coefficient is coded in 12 bits, the parity of the sum of the 10 most significant bits is taken;

next, the least significant bit (LSB) is replaced with the result of the exclusive OR operation (denoted XOR) between $w_k$ and the check bit dependent on the current coefficient.

This operation is repeated for all the coefficients selected in each block processed.

Then, during a step 56, a reverse discrete cosine transformation is effected on each block. Then a watermarked image I' is obtained.

Figure 6:
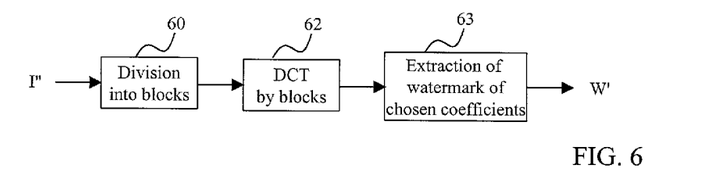
FIG. 6 illustrates schematically a technique for extracting a watermark from an image watermarked by a technique such as the one illustrated in FIG. 5.

At the decoder, the steps illustrated in FIG. 6 are applied.

Steps 60 of dividing into blocks and 62 of DCT by blocks are applied once again. The same criterion of preselection of the coefficients which are assumed to have been watermarked on encoding is also applied.

Next, during a step 63, the extraction proper of the watermark is effected. For each coefficient chosen in each DCT block, the check bit is recalculated by applying exactly the same calculation formula as on encoding, namely, for example, the parity of the sum of the most significant bits.

The estimated value $\hat{w}'_k$ of the watermark is equal to the result of the exclusive OR operation between the least significant bit of the coefficient processed and the check bit.

In order to evaluate the extracted watermark W', by comparison with the known watermark W, it is possible to calculate a percentage of extracted binary values $w'_k$ which are erroneous.

For each DCT block, it is possible to have several extracted values, according to the number of preselected coefficients in this block.

The true value $w_k$ is also known. If it is wished to obtain a very high quality of reconstruction, it is possible to decide that the extracted value for the inserted bit $w_k$ is erroneous as soon as one of the corresponding extracted values is erroneous.

Alternatively, if it is wished to obtain an average quality, it is possible first of all to make a majority choice and estimate that the result is erroneous if the majority of the extracted values are erroneous. There is thus obtained, for each bit of W, a diagnosis according to whether the extracted value is correct or erroneous.

The evaluation of the quality of the extracted watermark W' with respect to the known watermark W can consist simply of calculating the percentage of erroneous extracted values. If the percentage is greater than or equal to 50%, it is necessary to add iterations to the decoder in order to improve the quality of the decoding.

It should be noted that the quality of the extracted watermark W' can be evaluated spatially. It is then if necessary possible to decide to iterate the decoding solely on sub-parts of the data which have been particularly badly decoded.

A second watermarking technique able to be used, disclosed in the document EP-A-1 043 687, will now be described.

It is a method of the "spread spectrum" type in which a set of coefficients of the image is modified by the addition of a pseudo-random signal for inserting each information bit. The advantage of this method is that the decoding of the watermark is effected by means of a statistical test, which makes it possible to associate a probability of error straight-away.

Assume for example that a single information bit is inserted in the image, equal to 1, which represents the presence of the watermark. It is possible easily to extend to the case where it is sought to insert several information bits.

The principle of insertion/extraction of the watermark is as follows. A set of N coefficients representing the image (in the spatial domain or a transformed domain), denoted $X_i$, $1 \leq i \leq N$, read in a predetermined order, is considered. A drawing is made of N pseudo-random numbers for a known law (for example uniform law on [−1,1]), denoted $n_i$, and the following formula is applied:

$$X'_i = X_i + \alpha_i \cdot n_i, \ 1 \leq i \leq N \quad (1)$$

The weighting coefficients $\alpha_i$ are calculated according to considerations on visibility of the inserted watermark.

Decoding is effected by means of a test on the correlation between a set of tested coefficients $X'_i$ and the same pseudo-random signal as at the encoder. Let $Y_i = X'_i \cdot n_i$. If the insertion of the watermark has indeed been carried out as above, the average of $Y = (Y_1, \ldots, Y_i, \ldots, Y_N)$ must tend towards $E(\alpha_i \cdot n_i^2)$, where E designates the mathematical expectation. However, the weightings being positive, this value can be calculated, and is distant from 0. If on the other hand the watermark had not been inserted, the average of Y must tend towards 0.

A statistical test is applied to the average of Y, as described in the work by Papoulis entitled "*Probability and statistics*", published by Prentice Hall:

$$t = \frac{E[Y]}{\sigma_Y} \sqrt{N} \quad (2)$$

where $\sigma_Y$ is the standard deviation of Y.

The value of the test follows a standardised Gaussian law, centered around 0 if the watermark has not been inserted (assumption $H_0$) and centered around a non-zero value m if the watermark has been inserted (assumption $H_1$). It is therefore possible to characterise the probability of error with respect to assumption Ho and to fix a detection limit threshold $T_d$.

This method is applied here in the following manner. At the encoder, a recursive search is made (described in the document EP-A-1 043 687) for a block of the image of minimum size for which a detection criterion is validated. The detection criterion is $t \geq T_i$, where $T_i$ is a predetermined value. $T_i$ is advantageously chosen so as to be large, for example equal to 10 or 15. The insertion is applied as indicated in formula (1) given above.

At the decoder, there is applied the search algorithm for the block on which the watermark was inserted as indicated in the document EP-A-1 043 687, with a decoding threshold $T_d$ such that $T_d < T_i$. For example, $T_d = 4$.

At the time of decoding, the detection test is calculated on the data received as indicated by equation (2) given above.

The real value of the variable t is a good estimator of the quality of the extraction of the watermark.

If no block of the image on which $T_d \leq t \leq T_i$, is found, it is possible to deduce immediately therefrom that the quality of the decoding is insufficient.

If the support on which insertion took place is found, it is possible to judge on the quality of the extraction with respect to the position of t in the interval $[T_d, T_i]$ and it is possible to decide on additional iterations in consequence.

For example, the standardised distance between t and $T_i$ can be associated with a quantification of the quality of the data. For example, if this distance is between 0 and 10%, a further iteration is not carried out on turbodecoding; if it is between 10% and 20%, an additional iteration is carried out, and so on.

Figure 7:
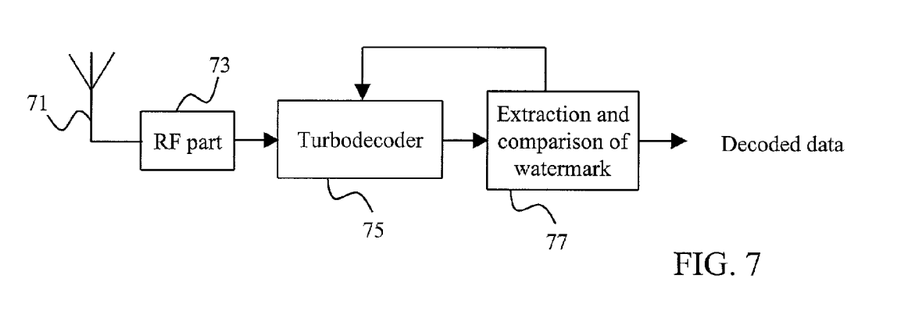
FIG. 7 depicts schematically a receiving device according to the present invention, in a particular embodiment.

As shown in FIG. 7, at the time of reception, the unknown data received by means of an antenna 71 and a radiofrequency unit 73 are first of all decoded by a turbodecoder 75 with a certain number of iterations, for example 4, this example being in no way limitative. Next the watermark is extracted from the data and compared with its non-transmitted version which is known, in a unit 77 for extracting and comparing the watermark. According to the results of this comparison, the number of iterations of the turbodecoder is possibly modified and takes account of the quality of the channel.

Figure 8:
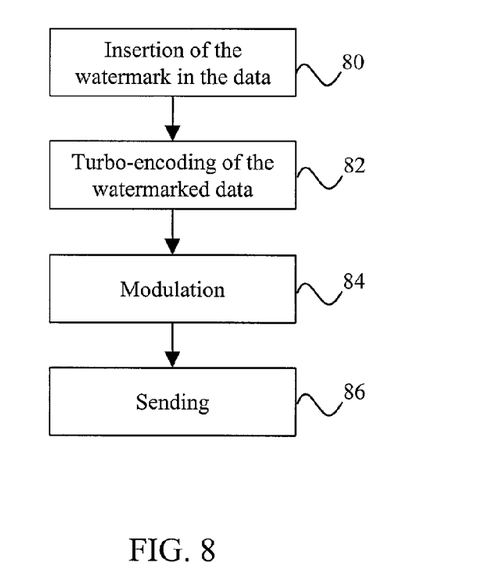
FIG. 8 is a flow diagram illustrating the main steps of the sending method according to the present invention, in a particular embodiment.

The sending method according to the present invention, in a preferred embodiment, is illustrated in FIG. 8.

During a first step 80, a watermark is inserted in the data to be transmitted using a watermarking encoder, by means of one of the techniques described above.

Then, during a step 82, the watermarked data are encoded by means of a turbo-encoder.

Next, during a step 84, the data obtained at the end of step 82 are modulated, for example by a QPSK modulation or an OFDM modulation.

In this way modulated symbols are obtained, which are sent during a step 86.

Figure 9:
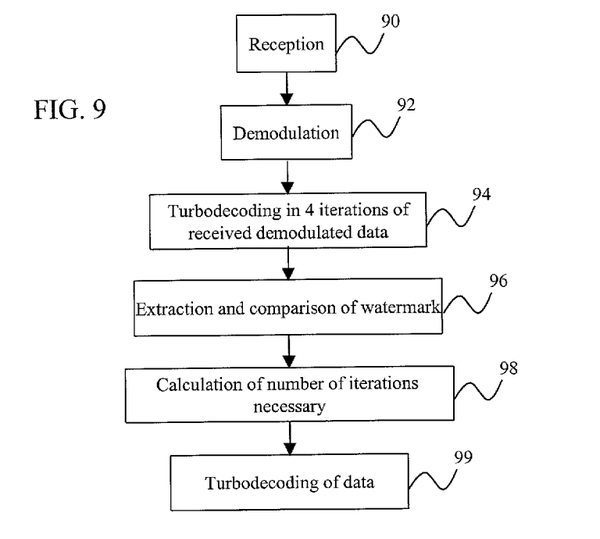
FIG. 9 is a flow diagram illustrating the main steps of the receiving method according to the present invention, in a particular embodiment.

The reception method according to the present invention, in a preferred embodiment, is illustrated in FIG. 9.

A first step 90 consists of receiving modulated data, for example QPSK symbols or OFDM symbols, sent by the transmitter.

These symbols are then demodulated during a step 92.

A step 94 then consists of turbodecoding the received and demodulated data, for example with four iterations, this example being in no way limitative.

During a step 96, the watermark is extracted and compared with its perfect version known to the receiver.

Then, during a step 98, the number of iterations actually necessary is calculated according to the estimation of the watermark made at the previous step.

Finally, during a step 99, the turbodecoding of the data is effected with the number of iterations calculated at step 98.

Figure 10:
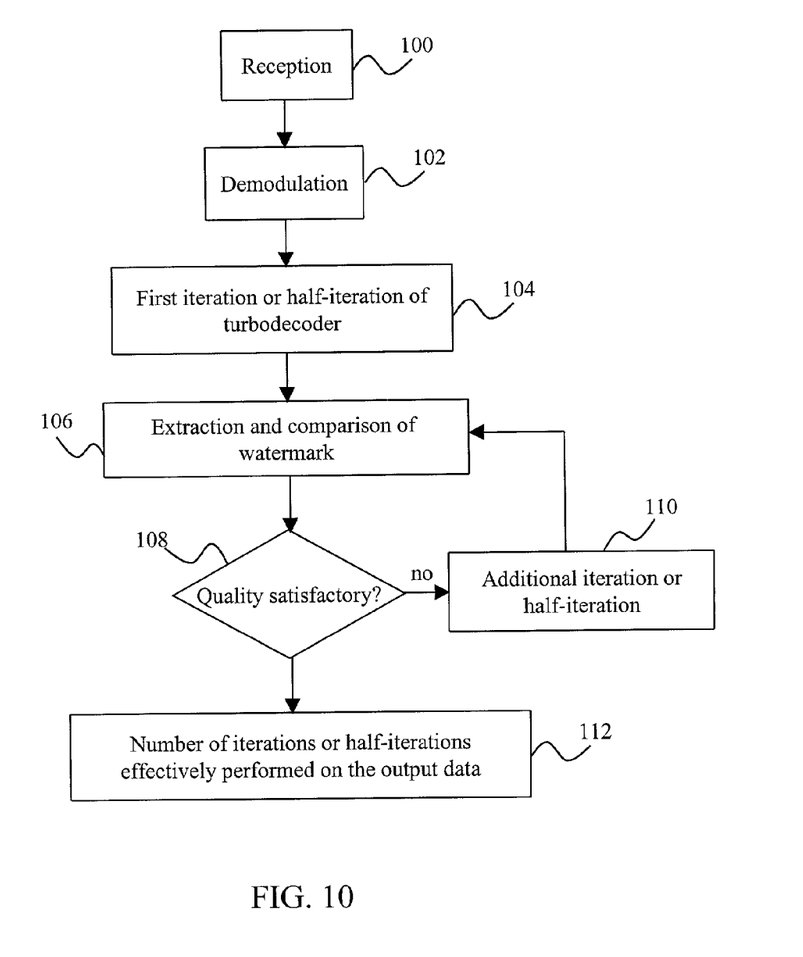
FIG. 10 is a flow diagram illustrating the main steps of the receiving method according to the present invention, in a variant embodiment.

FIG. 10 illustrates a variant of the reception method of the invention.

In this variant, the reception step 100 and the demodulation step 102 are respectively identical to steps 90 and 92 of the embodiment in FIG. 9.

A step 104 then consists of turbodecoding the received and demodulated data with a first iteration or half-iteration. It should be stated here that a complete iteration corresponds to the passing of the data through the two decoders of the turbodecoder (see FIG. 2), whilst a half-iteration corresponds to passing the data through only one decoder.

During each decoding iteration or even half-iteration, at step 106, the watermark is extracted and compared with its perfect version known to the receiver.

During a test 108, it is tested whether or not the desired quality is achieved and, as long as this is not the case, iteration is continued by complete iteration or half-iteration through step 110.

When a satisfactory quality is obtained, the decoding is stopped and the number of iterations actually effected is stored. The data turbodecoded with this number of iterations or half-iterations are then delivered as an output during step 112.

Figure 11:
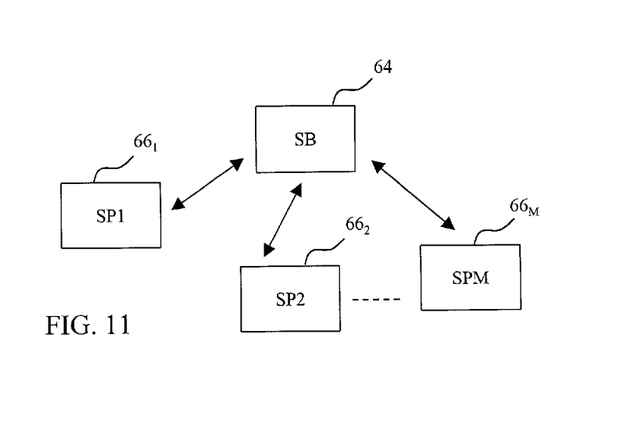
FIG. 11 depicts schematically a telecommunications network according to the present invention, in a particular embodiment.

As shown in FIG. 11, a network according to the invention consists of a station known as a base station SB designated by the reference 64, and several peripheral stations SPi, i=1, . . . , M, M being an integer greater than or equal to 1, respectively designated by the references $66_1, 66_2, \ldots, 66_M$. The peripheral stations $66_1, 66_2, \ldots, 66_M$ are distant from the base station SB, each connected by a radio link with the base station SB and able to move with respect to the latter.

Figure 12:
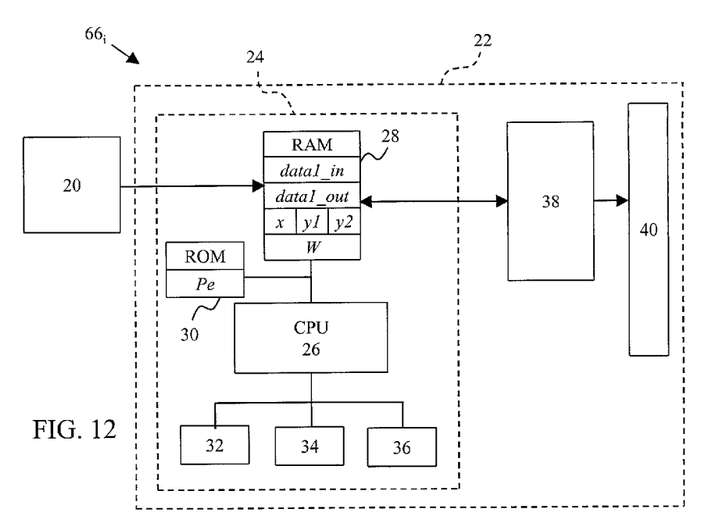
FIG. 12 depicts schematically a mobile station in a telecommunications network like the one in FIG. 11, used for sending according to the present invention, in a particular embodiment.

The block diagram in FIG. 12 depicts a more detailed view of a peripheral station SPi, i=1, . . . , M according to the invention which comprises a data source 20 and a sending device 22.

The peripheral station SPi has for example a digital camera, a computer, a printer, a server, a facsimile machine, a scanner or a digital photographic apparatus.

The sending device 22 comprises a data processing unit 24 comprising a calculation unit CPU (in English "Central Processing Unit") 26, a temporary data storage means 28 (RAM memory), a data storage means 30 (ROM memory), character entry means 32, such as a keyboard for example, image reproduction means 34 such as a screen for example, and input/output means 36.

The RAM 28 contains, in different registers:

input data "data1_in", coming from the data source 20;

output data "data1_out", obtained at the end of the sending method of the invention;

the current elements of the series of bits x, y1, y2 coming from the turbo-encoder, in a particular embodiment in which the turbo-encoder has two parities; and the watermark W to be inserted in the data.

The peripheral station SPi also comprises a sending unit 38 and a radio module 40 having a known sender with one or more modulators, filters and a radio antenna (not shown).

The sending device 22, by virtue of the program "Pe", stored in the ROM 30 and whose sequence of instructions corresponds to the steps of the sending method of the invention, is able to execute the steps of the sending method illustrated in FIG. 8.

Figure 13:
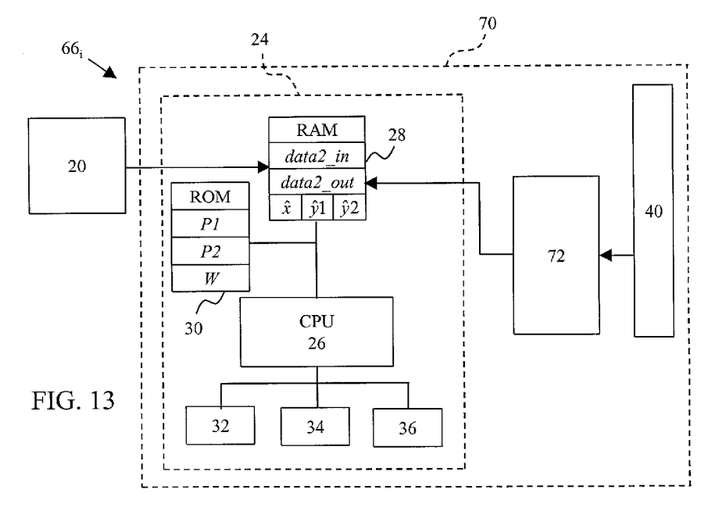
FIG. 13 depicts schematically a mobile station in a telecommunications network like the one in FIG. 11, used for reception in accordance with the present invention, in a particular embodiment.

The peripheral station SPi according to the invention also comprises, as shown in FIG. 13, a receiving device 70 which consists of a data processing unit corresponding to the data processing unit 24 already described with reference to FIG. 12, a receiving unit 72 and a radio module 40 with its antenna as depicted in FIG. 12.

In the receiving device 70, the RAM 28 contains, in different registers:

input data "data2_in", coming from the transmitter, after passing through a transmission channel;

output data "data2_out", obtained at the end of the receiving method of the invention, in any one of its embodiments; and the estimates $\hat{x}, \hat{y}1, \hat{y}2$ corresponding to the current elements of the series of bits x, y1, y2 which come from the turbo-encoder used by the transmitter.

The reception device 70, by virtue of the watermark W stored in the ROM 30 and by virtue of the programs "P1" and "P2" stored in the ROM 30 and whose sequences of instructions correspond respectively to the steps of the receiving method according to the invention in its two embodiments, is able to execute, either the steps of the embodiment illustrated in FIG. 9, or the steps of the embodiment illustrated in FIG. 10.

The invention claimed is:

1. A method of sending a digital signal, comprising the steps of:

inserting a watermark, which is known to a receiving end, in the digital signal, so as to obtain a watermarked digital signal;

encoding the watermarked digital signal by means of an encoder, so as to obtain an encoded watermarked signal which can be decoded by means of a parametrisable iterative decoder; and sending the encoded, watermarked signal, wherein the sent, encoded watermarked signal is processable by the receiving end to obtain the watermark, to compare the obtained watermark to a known watermark, and to modify at least one parameter of the decoder according to a result of the comparison between the watermark obtained from the sent, encoded watermarked signal and the known watermark.

2. A sending method according to claim 1, wherein said encoding step encodes the watermarked digital signal using a turbo-encoder.

3. A sending method according to claim 1, further comprising the step of modulating the encoded watermarked signal before performing said sending step.

4. A sending method according to claim 3, wherein said modulating step modulates the encoded watermarked signal by means of a modulation of the QPSK type.

5. A sending method according to claim 3, wherein said modulating step modulates the encoded watermarked signal by means of a modulation of the OFDM type.

6. A sending method according to claim 1, wherein said watermark insertion step uses a technique of the fragile or semi-fragile type.

7. A sending method according to claim 1, wherein said watermark insertion step is performed on a digital signal comprising an image signal.

8. A digital signal processing apparatus comprising:

means for processing a digital signal; and means for implementing a sending method for sending the processed digital signal according to claim 1.

9. A telecommunications network comprising:

a base station; and at least one peripheral station configured to communicate with said base station, wherein said at least one peripheral station comprises a sending device configured to implement a sending method according to claim 1.

10. A mobile station in a telecommunications network comprising:
   a source of data representable by a digital signal; and
   means for sending a digital signal representing the data according to the sending method of claim 1.

11. A base station in a telecommunications network comprising a sending device configured to implement a sending method according to claim 1.

12. An information storage medium readable by a computer or a microprocessor, and storing instructions of a computer program for instructing the computer or microprocessor to implement a sending method according to claim 1.

13. An information storage medium according to claim 12, wherein said information storage medium is partially or totally removable from a device in which said information storage medium is stored for reading by the computer or the microprocessor.

14. A computer program embodied in a computer readable medium for instructing a computer to perform sequences of instructions for implementing a sending method according to claim 1.

15. A device for sending a digital signal, comprising
   watermarking means for inserting a watermark, which is known to a receiving end, in the digital signal, said watermarking means outputting a watermarked digital signal;
   encoding means for encoding the watermarked digital signal by means of an encoder, said encoding means outputting an encoded watermarked signal decodable by means of a parameterisable iterative decoder; and
   sending means for sending said encoded watermarked signal, wherein the sent, encoded watermarked signal is processable by the receiving end to obtain the watermark, to compare the obtained watermark to a known watermark, and to modify at least one parameter of the decoder according to the result of the comparison between the watermark obtained from the sent, encoded watermarked signal and the known watermark.

16. A sending device according to claim 15, wherein said encoder is a turbo-encoder.

17. A sending device according to claim 15, further comprising modulation means for modulating the encoded watermarked signal.

18. A sending device according to claim 17, wherein said modulation means modulates the encoded watermarked signal by means of a modulation of the QPSK type.

19. A sending device according to claim 17, wherein said modulation means modulates the encoded watermarked signal by means of a modulation of the OFDM type.

20. A sending device according to claim 15, wherein said watermarking means use a technique of the fragile or semi-fragile type.

21. A sending device according to claim 15, wherein the digital signal is an image signal.

22. A digital signal processing apparatus comprising a sending device according to claim 15.

23. A telecommunications network comprising a sending device according to claim 15.

24. A mobile station in a telecommunications network comprising a sending device according to claim 15.

25. A base station in a telecommunications network comprising a sending device according to claim 15.

26. A method of decoding a received digital signal, the digital signal having been watermarked with a known watermark, comprising the steps of:
   decoding at least part of the received digital signal by means of a parameterisable iterative decoder;
   extracting the watermark from the decoded signal;
   comparing the extracted watermark with a known watermark; and
   modifying, if necessary, at least one parameter of the decoder according to the result of the comparison in said comparing step.

27. A decoding method according to claim 26,
   wherein said decoding step comprises the step of performing a number of decoding iterations on at least part of the received digital signal, and
   wherein said modifying step comprises the steps of:
      calculating the number of decoding iterations by determining the number of decoding iterations to be applied as a parameter of the decoding operation, according to the result of the comparison; and
      adjusting the decoding operation performed by said decoding step by applying to at least part of the received digital data the number of previously determined decoding iterations.

28. A decoding method according to claim 26,
   wherein said decoding step performs a partial decoding operation by decoding the received digital data by means of an iterative decoder, and applying a decoding iteration or a decoding half-iteration, so as to obtain a partially decoded watermarked digital signal, and
   wherein said modifying step comprises the steps of:
      performing a quality testing operation by testing whether the quality of the extracted watermark is satisfactory; and
      performing an additional decoding iteration or half-iteration when the quality testing is not satisfactory, so as to finally obtain the optimum number of decoding iterations or half-iterations to be applied as a parameter of the decoding operation.

29. A decoding method according to claim 26, wherein said decoding step is performed by an iterative decoder comprising a turbodecoder.

30. A decoding method according to claim 26, wherein the received digital signal is an image signal.

31. A digital signal processing apparatus comprising:
   means for decoding a received digital signal according to the decoding method of claim 26; and
   means for processing the received, decoded digital signal.

32. An information storage medium readable by a computer or a microprocessor, and storing instructions of a computer program for instructing the computer or microprocessor to implement a decoding method according to claim 26.

33. An information storage medium according to claim 32, wherein said information storage medium is partially or totally removable from a device in which said information storage medium is stored for reading by the computer or the microprocessor.

34. A computer program embodied in a computer readable medium for instructing a computer to perform sequences of instructions for implementing a decoding method according to claim 26.

35. A method comprising the steps of:
   receiving modulated encoded symbols containing a watermark;
   demodulating the received modulated encoded symbols, so as to obtain demodulated encoded data; and decoding the demodulated encoded data using a decoding method according to claim 26.

36. A method according to claim 35, wherein said demodulating step comprises the step applying a demodulation corresponding to a modulation of the QPSK type.

37. A method according to claim 35, wherein said demodulating step comprises the step of applying a demodulation corresponding to a modulation of the OFDM type.

38. A telecommunications network comprising:
a base station; and
at least one peripheral station configured to communicate with said base station, wherein said at least one peripheral station comprises a receiving device configured to implement a receiving method according to claim 35.

39. A mobile station in a telecommunications network comprising:
a module configured to receive electromagnetic signals; and
a device receiving the electromagnetic signals from said module and configured to perform the receiving method according to claim 35 on the electromagnetic signals received from said module.

40. A base station in a telecommunications network comprising a receiving device configured to implement a method according to claim 35.

41. A device for decoding a received digital signal, the digital signal having been watermarked with a known watermark, comprising:
decoding means for decoding at least part of the digital signal by means of a parameterisable iterative decoder;
watermark extracting means for extracting the watermark from the decoded signal;
comparing means for comparing the extracted watermark with the known watermark; and
modifying means for modifying, if necessary, at least one parameter of the decoding means according to the result of the comparison performed by said comparing means.

42. A decoding device according to claim 41,
wherein said decoding means performs a number of decoding iterations on at least part of the received digital signal,
wherein said modifying means comprises:
calculating means for calculating the number of decoding iterations to be performed by said decoding means, in order to determine the number of decoding iterations to be applied as a parameter of said decoding means, according to the result of the comparison by said comparing means; and
adjusting means for adjusting the decoding operations of said decoding means, in order to apply, during the decoding by the decoding means, the number of previously determined decoding iterations.

43. A decoding device according to claim 41,
wherein said decoding means comprises partial decoding means for decoding the received digital data by means of an iterative decoder, by applying a decoding iteration or a decoding half-iteration, said partial decoding means outputting a partially decoded watermarked digital signal; and
wherein said modifying means comprises quality testing means for testing whether the quality of the extracted watermark is satisfactory,
said partial decoding means effecting, as long as the quality is not satisfactory, an additional decoding iteration or half-iteration, so as to supply by the end of the decoding operation performed by said decoding means on the digital signal the optimum number of decoding iterations or half-iterations to be applied as a parameter of the decoding means.

44. A decoding device according to claim 41, wherein said iterative decoder is a turbodecoder.

45. A decoding device according to claim 41, wherein the received digital signal is an image signal.

46. A digital signal processing apparatus comprising a decoding device according to claim 41.

47. A device comprising:
receiving means for receiving modulated encoded, symbols containing a watermark;
demodulating means for demodulating the received modulated encoded symbols and outputting demodulated encoded data; and
decoding means for decoding the demodulated data by means of a decoding device according to claim 41.

48. A receiving device according to claim 47, wherein said demodulating means applies a demodulation corresponding to a modulation of the QPSK type.

49. A receiving device according to claim 47, wherein said demodulating means applies a demodulation corresponding to a modulation of the OFDM type.

50. A telecommunications network comprising a receiving device according to claim 47.

51. A mobile station in a telecommunications network, comprising a receiving device according to claim 47.

52. A base station in a telecommunications network comprising a receiving device according to claim 47.

* * * * *

UNITED STATES PATENT AND TRADEMARK OFFICE
CERTIFICATE OF CORRECTION

PATENT NO. : 7,013,023 B2 Page 1 of 1
APPLICATION NO. : 10/029673
DATED : March 14, 2006
INVENTOR(S) : Ehrmann Patin et al.

It is certified that error appears in the above-identified patent and that said Letters Patent is hereby corrected as shown below:

ON THE TITLE PAGE
At Item (57), Abstract, line 3, "parametrisable" should read --parameterisable--.

COLUMN 7
Line 56, "undergone any" should read --undergone--.

COLUMN 9
Line 42, "$Y_i = X^1_{i.ni.}$" should read --$Y_i = X^1_i.n_i.$--.
Line 66, "Ho" should read --$H_o$--.

COLUMN 12
Line 29, "parametrisable" should read --parameterisable--.

COLUMN 13
Line 24, "comprising" should read --comprising:--.
Line 55, "use" should read --uses--.

COLUMN 15
Line 4, "step" should read --step of--.

COLUMN 16
Line 29, "encoded," should read --encoded--.

Signed and Sealed this

Tenth Day of October, 2006

JON W. DUDAS
*Director of the United States Patent and Trademark Office*